(12) United States Patent
Fei et al.

(10) Patent No.: US 9,449,799 B2
(45) Date of Patent: Sep. 20, 2016

(54) FILM DEPOSITION DEVICE

(71) Applicants: Shanghai Tianma AM-OLED Co., Ltd., Shanghai (CN); Tianma Micro-Electronics Co., Ltd., Shenzhen (CN)

(72) Inventors: Qiang Fei, Shanghai (CN); Weiqi Xu, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/288,384

(22) Filed: May 27, 2014

(65) Prior Publication Data

US 2015/0187547 A1 Jul. 2, 2015

(30) Foreign Application Priority Data

Dec. 30, 2013 (CN) .......................... 2013 1 0746171

(51) Int. Cl.
*C23C 14/00* (2006.01)
*C25B 11/00* (2006.01)
*C25B 13/00* (2006.01)
*H01J 37/34* (2006.01)

(52) U.S. Cl.
CPC ........ *H01J 37/3405* (2013.01); *H01J 37/3408* (2013.01); *H01J 37/3417* (2013.01); *H01J 37/3452* (2013.01); *H01J 37/3455* (2013.01)

(58) Field of Classification Search
CPC ............. H01J 37/3408; H01J 37/3455; H01J 37/3452
See application file for complete search history.

(56) References Cited

U.S. PATENT DOCUMENTS

| | | | |
|---|---|---|---|
| 2007/0114122 A1* | 5/2007 | Ishibashi | C23C 14/0617 204/192.1 |
| 2008/0023319 A1 | 1/2008 | Le et al. | |
| 2009/0236221 A1* | 9/2009 | Zhang et al. | 204/298.12 |
| 2010/0206726 A1* | 8/2010 | Zhao et al. | 204/298.16 |
| 2011/0006022 A1 | 1/2011 | Caveney et al. | |

(Continued)

FOREIGN PATENT DOCUMENTS

| | | |
|---|---|---|
| CN | 201162043 Y | 12/2008 |
| CN | 102074446 B | 7/2012 |

(Continued)

OTHER PUBLICATIONS

Office Action as issued in corresponding German Application No. 102014107354.1, dated Sep. 2, 2015 and accompanying English-language summary.

*Primary Examiner* — Ibrahime A Abraham
(74) *Attorney, Agent, or Firm* — Alston & Bird LLP

(57) ABSTRACT

A film deposition device is disclosed. The device includes a driver, a sputtering target assembly, and at least one rotatable magnetoelectric device located at the back of the sputtering target assembly. The rotatable magnetoelectric device includes a transmission having a conveyor belt, and at least one pair of gears which cooperate with the conveyor belt and are disposed at an inner side of the conveyor belt, where an axial direction of the gears is substantially parallel to a surface of the sputtering target assembly. The rotatable magnetoelectric device also includes a first set of magnets, where the first set of magnets are disposed outside of the conveyor belt. In addition, the driver is configured to cause the gears to rotate.

13 Claims, 3 Drawing Sheets

(56) References Cited

U.S. PATENT DOCUMENTS

2011/0031116 A1    2/2011  Pei
2011/0062022 A1*   3/2011  Goderis et al. .......... 204/298.12
2011/0186425 A1*   8/2011  Ohmi et al. ............. 204/298.08

FOREIGN PATENT DOCUMENTS

CN    203096163 U    7/2013
JP    63125675 A     5/1988

* cited by examiner

FILM DEPOSITION DEVICE

CROSS-REFERENCES TO RELATED APPLICATIONS

This application claims priority to a Chinese patent application No. 201310746171.4 filed on Dec. 30, 2013 and titled "Film Deposition Device", which is incorporated herein by reference in its entirety.

TECHNICAL FIELD

The present application relates to the field of semiconductor technologies, in particular to a film deposition device.

BACKGROUND OF THE INVENTION

Currently, a film deposition method is one of the most popular surface treatment methods, and is applicable to treat surfaces of decorations, dishware, cutters, tools, molds, semiconductor components, and so on.

The film deposition is to grow a layer of thin film of homogeneous or heterogeneous material on a substrate surface such as various metal surfaces, superhard alloy surfaces, ceramic surfaces or wafer substrate surfaces, to obtain properties such as a good appearance, wear resistance, heat resistance, corrosion resistance, etc. In the process of the film deposition, the required inert gas (which is generally argon (Ar) gas) is filled in a high vacuum chamber. Orthogonal magnetic and electric fields are applied between a sputtering target and a substrate in the high vacuum chamber, particularly, a permanent magnet forms a magnetic field of 250 to 350 gauss on the surface of the sputtering target, and the magnetic field constitutes an orthogonal electromagnetic field together with a high voltage electric field. The Ar gas is ionized to generate positive ions and negative electrons under the effect of the electric field. A certain negative high voltage is applied on the sputtering target, so that electrons emitted from a target pole, which are under the effect of the orthogonal electromagnetic field, increase the ionization possibility of the working gas, to form high-density plasma near the sputtering target. Ar ions are accelerated and moved towards a target surface by a Lorentz force, to hit the sputtering target at a high speed, so that atoms sputtered from the sputtering target depart from the target surface and move at a high kinetic energy to the substrate according to momentum transfer principles, and then are deposited on the substrate surface to form a film.

BRIEF SUMMARY OF THE INVENTION

One inventive aspect is a film deposition device, including a driver, a sputtering target assembly, and at least one rotatable magnetoelectric device located at the back of the sputtering target assembly. The rotatable magnetoelectric device includes a transmission having a conveyor belt, and at least one pair of gears which cooperate with the conveyor belt and are disposed at an inner side of the conveyor belt, where an axial direction of the gears is substantially parallel to a surface of the sputtering target assembly. The rotatable magnetoelectric device also includes a first set of magnets, where the first set of magnets are disposed outside of the conveyor belt. In addition, the driver is configured to cause the gears to rotate.

BRIEF DESCRIPTION OF THE DRAWINGS

In order to more clearly illustrate technical solutions of embodiments of the present disclosure or the prior art, drawings used for the description of the embodiments or the prior art are briefly introduced below. Obviously, the drawings for the following description only show some embodiments of the present disclosure, and other drawings may also be obtained from the described drawings by those skilled in the art without any creative work.

DETAILED DESCRIPTION OF THE PREFERRED EMBODIMENTS

The technical solutions in the embodiments of the present disclosure are clearly and completely described below in combination with the drawings accompanying the embodiments of the present disclosure. Obviously, the described embodiments are some instead of all embodiments of the present disclosure. All other embodiments obtained in light of the described embodiments of the present disclosure by those skilled in the art without any creative work should fall within the protection scope of the present disclosure.

Figure 1:
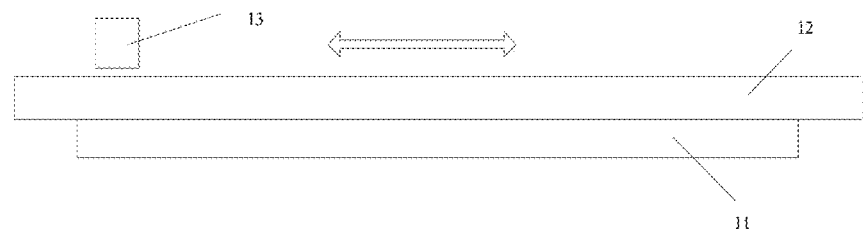
FIG. 1 shows a film deposition device in the prior art.

Currently, as shown in FIG. 1, a film deposition device includes a magnet 13, a backboard 12 and a sputtering target 11, where the magnet 13 is reciprocally movable above the backboard 12. Due to the uneven intensity of the magnetic field generated by the magnet, various portions of the sputtering target are depleted at difference speeds, such that the utilization of the sputtering target is low, for example no more than about 30%.

In view of the above, an embodiment of the present disclosure provides a film deposition device to solve the above technical problem.

Figure 2A:
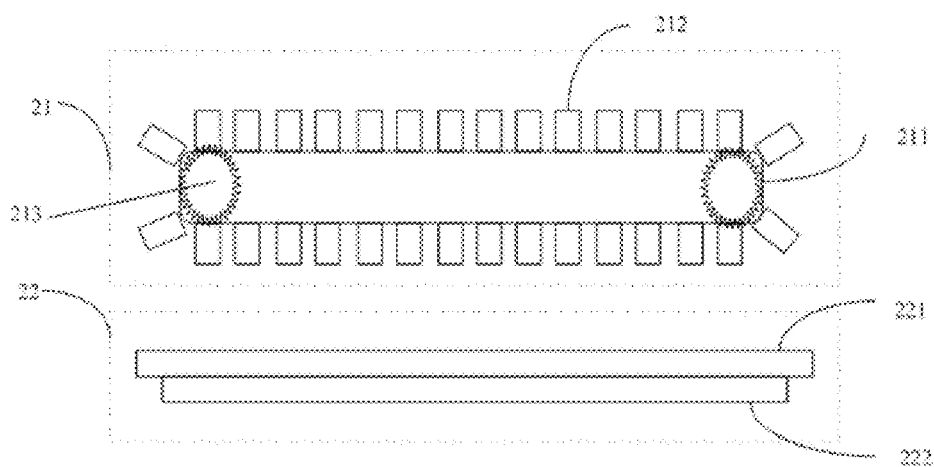
FIGS. 2(a) and 2(b) illustrate a schematic diagram showing the structure of a film deposition device according to an embodiment of the present disclosure.

FIG. 2(a) is a schematic diagram showing the structure of a film deposition device provided by an embodiment of the present disclosure. The film deposition device of the embodiment is applicable to deposit a film on a substrate in a high-vacuum chamber, and may be provided in any high-vacuum chamber.

Specifically, the file deposition device includes: driver (not shown), a sputtering target assembly 22, and the sputtering target assembly 22 includes a sputtering target 222 and a backboard 221, and at least one rotatable magnetoelectric device 21 located at the back of the sputtering target assembly 22, where the back of the sputtering target assembly 22 refers to a upside of the backboard 221 apart from the sputtering target 222, and the rotatable magnetoelectric device 21 includes transmission and a first set of magnets. The transmission includes a conveyor belt 211 and at least one pair of gears 213 which cooperate with the conveyor belt 211 and are disposed at the inside of the conveyor belt 211, and an axial direction of the gears 213 is parallel to the surface of the sputtering target assembly 22. The first set of magnets are disposed at the outside of the conveyor belt 211, the driver is configured to drive the gears 213 to rotate.

Specifically, the driver is configured to cause the transmission to rotate clockwise or counterclockwise. In practice, the driver may be a rotation motor, and any of the gears 213 disposed at the inside of the conveyor belt 211 is engaged with a gear attached to an output shaft of the rotation motor.

Furthermore, a rotation speed of the rotation motor may be adjusted appropriately as actually required, thereby adjusting the rotation speed of the rotatable magnetoelectric device 21 to control the time for forming a film on the substrate.

In the prior art, the sputtering target assembly operates at an operating temperature within a range of 300° C. to 400° C., one side of the sputtering target assembly is strongly cooled by cooling water, and the another side of the sputtering target assembly is placed in the high vacuum of high pressure, thus a large pressure difference is formed between these two sides of the sputtering target assembly. At the same time, the sputtering target assembly is subjected to impact of various particles. In this case, if the connection between the sputtering target and the backboard of the sputtering target assembly is not strong enough, then the sputtering target will be deformed, crack and finally peel off when being heated, which can not only cause an uneven thickness of the deposited film, but also cause a damage of the sputtered substrate.

In the embodiment of the present disclosure, the sputtering target 222 of the sputtering target assembly 22 is welded on the backboard 221 of the sputtering target assembly 22. It is preferable to weld the target sputtering 222 on the backboard 221 to improve the connection strength between the sputtering target 222 and the backboard 221. For example, a metal interlayer is formed on a welding surface of the sputtering target 222, while solder is placed on a welding surface of the backboard 221, and a brazing process is performed to heat and melt the solder, thereby welding the sputtering target 222 onto the backboard 221 to form the sputtering target assembly 22; then the sputtering target assembly 22 is thermally insulated and heat is diffused within the sputtering target assembly 22; and then the sputtering target assembly 22 is cooled and redundant solder is removed by mechanical machining.

It is noted that the conveyor belt 211 is a metal conveyor belt, which has better properties such as corrosion resistance, wear resistance and high temperature resistance than a rubber conveyor belt, and is operable properly in a high vacuum chamber with a high temperature and high pressure.

Referring to FIG. 2(a) again, specifically, the first set of magnets include a plurality of first magnets 212 forming a magnet group having a shape of crawler belt, and the first magnets 212 are evenly disposed along the outside of the conveyor belt 211. Each of the first magnets 212 has a strip shape, and has a length from a range of 10 mm to 1000 mm, a width from a range of 5 mm to 1000 mm and a height from a range of 5 mm to 1000 mm.

Here, at the outside of the magnet having a strip shape, magnetic induction lines are curved and run from an N pole to an S pole of the magnet, are dense at the ends of the N pole and the S pole, and are distributed evenly between the N pole and the S pole. Inside the magnet, magnetic induction lines are linear and run from the S pole to the N pole, and are distributed evenly.

Figure 2B:
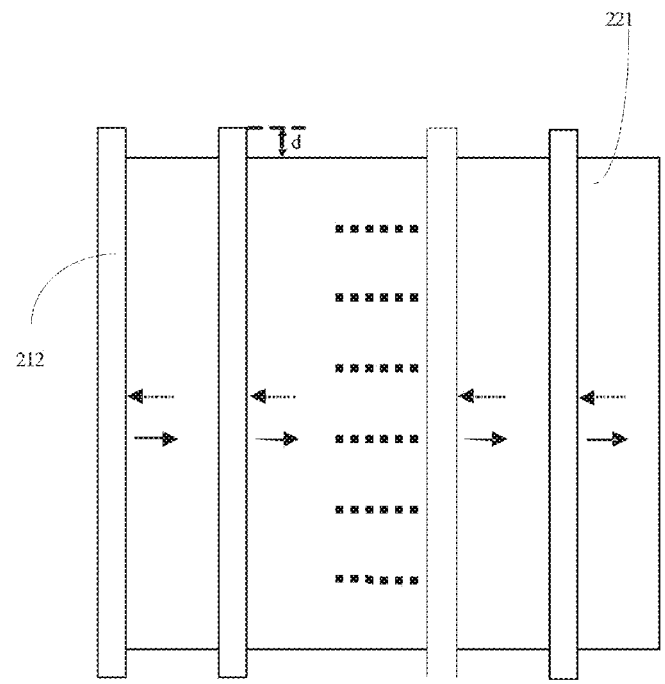

Considering the above principle, in order to obtain a relatively uniform intensity of the magnetic field for the sputtering target assembly 22, the length of each of the first magnets 212 along the axial direction of the gear is larger than the length of the backboard 221 along the axial direction, so that the sputtering target assembly 22 is disposed at a region where the magnetic induction lines are distributed evenly between the N pole and the S pole of each of the first magnets 212, thereby departing from regions with densely distributed magnetic induction lines at the N pole and the S pole of each of the first magnets 212. FIG. 2(b) shows a top view of the film deposition device. As shown in FIG. 2(b), preferably, the length of each of the first magnets 212 along the axial direction is longer than the length of the backboard 221 along the axial direction by a difference d from a range of 1 mm to 1000 mm.

In the film deposition device provided by the embodiment of the present disclosure, the rotation speed of the rotatable magnetoelectric device may be appropriately adjusted, such that the magnetic field has a high coverage rate on the surface of the sputtering target assembly, thereby improving the utilization of the sputtering target assembly.

Figure 3:
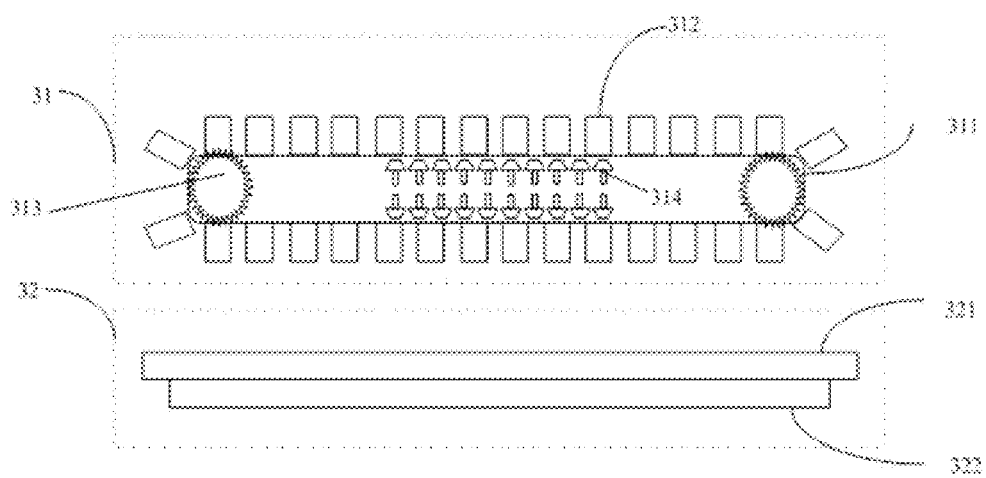
FIG. 3 is a schematic diagram showing the structure of a film deposition device according to another embodiment of the present disclosure.

FIG. 3 shows a film deposition device provided by another embodiment of the present disclosure. In the prior art, the deposited film might have an uneven thickness. To solve this problem, this embodiment of the present disclosure provides a film deposition device on the basis of the first embodiment to solve the problem of unevenness of the deposited film.

Specifically, the film deposition device of the second embodiment includes: driver, a sputtering target assembly 32, at least one rotatable magnetoelectric device 31 located at the back of the sputtering target assembly 32, where the rotatable magnetoelectric device 31 includes transmission and a first set of magnets, the transmission includes a conveyor belt 311 and at least one pair of gears 313 which cooperate with the conveyor belt 311 and are disposed at the inside of the conveyor belt 311, and an axial direction of the gears 313 is parallel to the surface of the sputtering target assembly 32. The first set of magnets are disposed at the outside of the conveyor belt 311, and include a plurality of first magnets 312 forming a magnet group having a shape of crawler belt. The driver is configured to drive the gears 313 to rotate, and the sputtering target assembly 32 includes a sputtering target 322 and a backboard 321.

The transmission further includes a plurality of adjusting screws 314, which have heads in contact with the inside of the conveyor belt 311, and are configured to adjust the distance between the first magnets 312 and the sputtering target assembly 32.

Specifically, the adjusting screws 314 are disposed correspondingly to the first magnets 312. For example, each of the adjusting screws 314 corresponds to one first magnet 312 to ensure that the distance from each of the first magnets 312 to the sputtering target assembly 32 is adjustable. By screwing any adjusting screw 314, the head of the adjusting screw 314 that is contact with the inside of the conveyor belt 311 will raise a first magnet 312 disposed on the conveyor belt 311, to shorten the distance between the first magnets 312 and the sputtering target assembly 32, such that the magnetic field intensity at the surface of the sputtering target assembly 32 is changed, thereby alleviating or even eliminating the unevenness of the deposited film.

With the structure of the film deposition device provided by the second embodiment of the present disclosure, it is allowed to adjust the distance between the first magnets 312 and the sputtering target assembly 32 to change the magnetic field intensity of the surface of the sputtering target assembly 32, thereby alleviating or even eliminating the unevenness of the deposited film.

Figure 4:
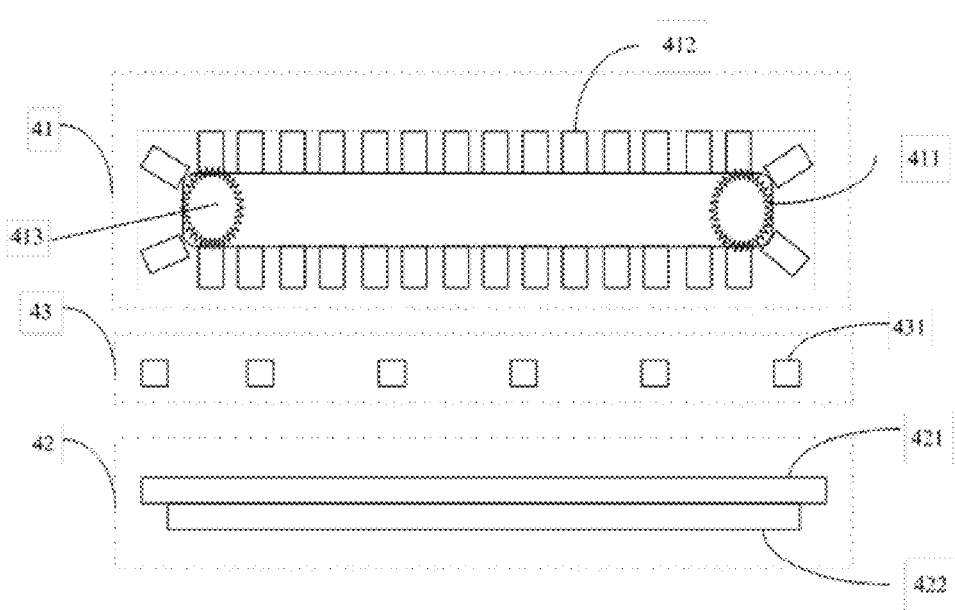
FIG. 4 is a schematic diagram showing the structure of a film deposition device according to another embodiment of the present disclosure.

FIG. 4 is a schematic diagram showing the structure of a film deposition device provided by another embodiment of the present disclosure. Based on the above provided embodiments of the present disclosure, this embodiment of the present disclosure provides a film device including: driver, a sputtering target assembly 42, at least one rotatable magnetoelectric device located at the back of the sputtering target assembly 42, where the rotatable magnetoelectric device includes transmission and a first set of magnets, which include a plurality of first magnets 412 forming a magnet group having a shape of crawler belt. The transmission includes a conveyor belt 411, and at least one pair of gears 413 which cooperate with the conveyor belt 411 and are disposed at the inside of the conveyor belt 411, an axial direction of the gears 413 is parallel to the surface of the sputtering target assembly 42, and the first set of magnets are disposed at the outside of the conveyor belt 411. The driver is configured to cause the gears 413 to rotate, and the sputtering target assembly 42 includes a sputtering target 422 and a backboard 421.

The film deposition device of this embodiment further includes at least one reciprocating transmission 43, which is located at the back of the sputtering target assembly 42 and are disposed in parallel to the rotatable magnetoelectric device 43.

Specifically, a second set of magnets are disposed on the reciprocating transmission 43, which in turn causes the second set of magnets to move reciprocally in parallel to the axial direction. The second set of magnets include a plurality of second magnets 431, which are spaced evenly and allowed to move reciprocally in parallel to the axial direction within their respective movement ranges. In practice, each of the magnets can be driven by the same reciprocating driving motor of the driver, or can be driven by a different reciprocating driving motor of the driver. By adjusting the rotation speed of the reciprocating driving motor, the speed of reciprocating motion of each of the second magnets 431 can be adjusted to control the thickness of the deposited film.

It is noted that the plurality of magnets of the second set of magnets each have a length of a range from 10 mm to 1000 mm, a width of a range from 5 mm to 1000 mm, and a height of a range from 5 mm to 1000 mm.

Here, at the outside of the magnet having a strip shape, magnetic induction lines are curved and run from an N pole to an S pole of the magnet, are dense at the ends of the N pole and the S pole, and are distributed evenly between the N pole and the S pole. Inside the magnet, magnetic induction lines are linear and run from the S pole to the N pole, and are distributed evenly.

Considering the above principle, in order to obtain a relatively uniform intensity of the magnetic field for the sputtering target assembly 42, the length of each of the second magnets 413 along the axial direction of the gear is larger than the length of the backboard 421 along the axial direction, so that the sputtering target assembly 42 is disposed at a region where the magnetic induction lines are distributed evenly between the N pole and the S pole of each of the second magnets 431, thereby departing from regions with densely distributed magnetic induction lines at the N pole and the S pole of each of the second magnets 431. Preferably, the length of each of the second magnets 431 along the axial direction is longer than the length of the backboard 421 along the axial direction by 1 mm to 1000 mm.

In the film deposition device provided by this embodiment of the present disclosure, the rotation speed of the rotatable magnetoelectric device may be appropriately adjusted, such that the magnetic field has a high coverage rate on the surface of the sputtering target assembly, thereby improving the utilization of the sputtering target assembly.

The embodiments of the present disclosure have been described as above, but are not intended to limit the present disclosure. Various modifications and changes of the present disclosure can be made by those skilled in the art. Any modifications, equivalent substitutions, improvement, etc., made within the spirits and principles of the disclosure, should fall into the scope of protection of the present invention.

What is claimed is:

1. A film deposition device, comprising:
   a driver;
   a sputtering target assembly; and
   at least one rotatable magnetoelectric device located at the back of the sputtering target assembly, wherein the rotatable magnetoelectric device comprises:
   a transmission, comprising:
   a conveyor belt, and
   at least one pair of gears which cooperate with the conveyor belt and are disposed at an inner side of the conveyor belt, wherein an axial direction of the gears is substantially parallel to a surface of the sputtering target assembly, and
   a first set of magnets, wherein the first set of magnets are disposed outside of the conveyor belt,
   wherein the driver is configured to cause the gears to rotate;
   the film deposition device further comprising at least one reciprocating transmission, which is located at the back of the sputtering target assembly and is disposed in parallel with the rotatable magnetoelectric device,
   wherein a second set of magnets, which includes a plurality of second magnets, is disposed on the reciprocating transmission, and the reciprocating transmission is configured to cause the second set of magnets to move reciprocally in parallel to the axial direction, and a speed of reciprocating motion of each of the second magnets is adjusted to control thickness of a deposited film;
   wherein the first set of magnets comprises a plurality of first magnets, and a plurality of adjusting screws; the plurality of first magnets are evenly spaced and disposed on the conveyor belt each of the plurality of adjusting screws corresponds to a respective one of the plurality of first magnets, has a head in contact with the inner side of the conveyor belt, and is configured to adjust the distance between the respective one of the plurality of first magnets and the sputtering target assembly, and
   wherein the plurality of second magnets are evenly spaced and configured to move reciprocally in parallel to the axial direction, each of the plurality of second magnets is driven by a respective one of reciprocating driving motors of the driver.

2. The film deposition device of claim 1, wherein the plurality of second magnets are evenly spaced and configured to move reciprocally in parallel to the axial direction.

3. The film deposition device of claim 1, wherein the sputtering target assembly comprises a sputtering target and a backboard.

4. The film deposition device of claim 3, wherein a length of each of the first magnets along the axial direction is greater than a length of the backboard along the axial direction.

5. The film deposition device of claim 4, wherein the length of each of the first magnets along the axial direction is greater than the length of the backboard along the axial direction by 1 mm to 1000 mm.

6. The film deposition device of claim 2, wherein the sputtering target assembly comprises a sputtering target and a backboard.

7. The film deposition device of claim 6, wherein a length of each of the second magnets along the axial direction is greater than a length of the backboard along the axial direction.

8. The film deposition device of claim 7, wherein the length of each of the second magnets along the axial direction is greater than the length of the backboard along the axial direction by 1 mm to 1000 mm.

9. The film deposition device of claim 1, wherein each of the first magnets has a length within a range from 10 mm to 1000 mm, a width within a range from 5 mm to 1000 mm and a height within a range from 5 mm to 1000 mm.

10. The film deposition device of claim 2, wherein the plurality of magnets of the second set of magnets each have a length within a range from 10 mm to 1000 mm, a width within a range from 5 mm to 1000 mm and a height within a range from 5 mm to 1000 mm.

11. The film deposition device of claim 3, wherein the sputtering target is welded on the backboard.

12. The film deposition device of claim 1, wherein the driver is configured to cause the transmission to rotate clockwise or counterclockwise.

13. The film deposition device of claim 6, wherein the sputtering target is welded on the backboard.

* * * * *